(12) United States Patent
Lindström et al.

(10) Patent No.: US 11,749,465 B2
(45) Date of Patent: Sep. 5, 2023

(54) PHOTOVOLTAIC DEVICE

(71) Applicant: Exeger Operations AB, Stockholm (SE)

(72) Inventors: Henrik Lindström, Danderyd (SE); Giovanni Fili, Danderyd (SE); Jarl Nissfolk, Enebyberg (SE); Daniel Sundqvist, Bromma (SE)

(73) Assignee: EXEGER OPERATIONS AB, Stockholm (SE)

(*) Notice: Subject to any disclaimer, the term of this patent is extended or adjusted under 35 U.S.C. 154(b) by 195 days.

(21) Appl. No.: 17/046,905

(22) PCT Filed: May 10, 2019

(86) PCT No.: PCT/EP2019/062067
§ 371 (c)(1),
(2) Date: Oct. 12, 2020

(87) PCT Pub. No.: WO2019/219538
PCT Pub. Date: Nov. 21, 2019

(65) Prior Publication Data
US 2021/0151259 A1  May 20, 2021

(30) Foreign Application Priority Data

May 16, 2018 (SE) .................................. 1850573-5
Sep. 20, 2018 (EP) .................................. 18195678

(51) Int. Cl.
*H01L 31/00* (2006.01)
*H01G 9/20* (2006.01)
*H01L 31/0224* (2006.01)

(52) U.S. Cl.
CPC ......... *H01G 9/2031* (2013.01); *H01G 9/2013* (2013.01); *H01G 9/2022* (2013.01);
(Continued)

(58) Field of Classification Search
CPC .. H01G 9/2031; H01G 9/2013; H01G 9/2022; H01G 9/2059; H01G 9/2077
See application file for complete search history.

(56) References Cited

U.S. PATENT DOCUMENTS

2009/0050190 A1* 2/2009 Nishida ............... H01L 31/0516
136/244
2012/0103408 A1* 5/2012 Moslehi ............... H01L 31/0516
136/256
(Continued)

FOREIGN PATENT DOCUMENTS

EP        3503141 A1    6/2019
KR     20140139127 A   12/2014
(Continued)

OTHER PUBLICATIONS

International Search Report and Written Opinion from corresponding International Application No. PCT/EP2019/062067, dated Jul. 15, 2019, 11 pages.

*Primary Examiner* — Thanh Truc Trinh
(74) *Attorney, Agent, or Firm* — TUCKER ELLIS LLP

(57) ABSTRACT

The present invention relates to a photovoltaic device (1). The device comprises a solar cell unit (2) comprising a porous light-absorbing layer (3) at a top side (2a), of a porous first conducting layer (4), a porous substrate (5) of an insulating material. The solar cell unit comprises a conducting medium. The photovoltaic device comprises a first conductor (7) in electrical contact with the first conducting layer (4), a second conductor (8) in electrical contact with the second conducting layer (6), and an encapsulation (9) encapsulating the solar cell unit. The encapsulation comprises a top sheet (9a) and a bottom sheet (9b). The first and second conductors (7, 8) are arranged between the encapsulation (9) and the solar cell unit (2) at the bottom side (2b) of the solar cell unit (2). The second conductor (8) is (Continued)

arranged between the second conducting layer (6) and the bottom sheet (9*b*) of the encapsulation (9), and the first conductor (7) is arranged between the porous substrate (5) and the bottom sheet (9*b*). The first conductor (7) is electrically insulated from the second conducting layer (6). A part (14) of the porous substrate (5) comprises conducting material (12) disposed between the first conductor (7) and the first conducting layer (4) to provide electrical contact between the first conductor and the first conducting layer.

20 Claims, 4 Drawing Sheets

(52) U.S. Cl.
CPC ......... *H01G 9/2059* (2013.01); *H01G 9/2077* (2013.01); *H01L 31/022441* (2013.01)

(56) References Cited

U.S. PATENT DOCUMENTS

| | | |
|---|---|---|
| 2013/0037089 A1 | 2/2013 | Sasaki et al. |
| 2013/0174906 A1* | 7/2013 | Lindstrom ........... H01G 9/2022 |
| | | 136/256 |
| 2014/0076385 A1 | 3/2014 | Cha et al. |
| 2014/0166095 A1 | 6/2014 | Loscutoff et al. |

FOREIGN PATENT DOCUMENTS

| | | |
|---|---|---|
| KR | 101530547 B1 | 6/2015 |
| WO | 2013149787 A1 | 10/2013 |
| WO | 2013149789 A2 | 10/2013 |
| WO | 2014184379 A1 | 11/2014 |
| WO | 2015117795 A1 | 8/2015 |
| WO | 2018021952 A1 | 2/2018 |

* cited by examiner

PHOTOVOLTAIC DEVICE

TECHNICAL FIELD

The present invention relates to photovoltaic devices. More particular, the invention relates to photovoltaic devices suitable for charging electronic devices for consumer applications.

BACKGROUND

Photovoltaic devices provide conversion of light into electricity. A typical photovoltaic device comprises one or more solar cells. Solar cells are well-known devices for converting solar radiation to electrical energy. A solar cell has a front side that faces the sun during normal operation to collect solar radiation and a back side opposite the front side.

On the back side of a traditional solar cell, a metal plate collects excess charge-carriers from a base, and on the front side, metal grids and metal wires collect excess charge-carriers from an emitter. Thus, conventional silicon solar cells have a front-side contacted emitter. A problem with using current collecting grids and wires on the front side of the solar cell is that there is a trade-off between good current collection and light harvesting. By increasing the size of the metal wires, the conduction is increased, and the current collection is improved. However, by increasing the size of the metal grids and wires more of the sun harvesting area is shaded, leading to a reduced efficiency of the solar cell.

Back-contact solar cells achieve higher efficiency by moving the front-side contacted emitter to the rear side of the solar cell. The higher efficiency results from the reduced shading on the front side of the solar cell. There exist several configurations of back-contact solar cells. In an all back-contact solar cell, all metal contacts and corresponding emitters are formed on the backside of the solar cell. An external electrical circuit, e.g. a load, may be connected to the metal contacts to be powered by the solar cell.

US 2014166095 A1 shows an example of a back-contact solar cell having a hybrid emitter design. The solar cell has a thin dielectric layer formed on a back side surface of a single crystalline silicon substrate. One emitter of the solar cell is made of doped polycrystalline silicon that is formed on the thin dielectric layer. The other emitter of the solar cell is formed in the single crystalline silicon substrate and is made of doped single crystalline silicon. The solar cell includes contact holes through the stack of material to allow metal contacts to connect to corresponding emitters. The metal contacts are all formed on the back side of the solar cell. For example, the metal contact may comprise aluminum formed on an emitter, a diffusion barrier comprising titanium-tungsten formed on the aluminum, and a seed layer comprising copper formed on the diffusion barrier. Generally, there is a large number of emitters in the solar cell, and each is connected to a corresponding contact hole. This results in a large number of holes. It is time-consuming to drill the holes through the stack of material and to fill them with the metal layer, the diffusion barrier and the seed layer. Thus, a disadvantage with this solar cell is that the production of the contacts is complex and costly.

WO 2013/149787 A1 discloses another example of a back-contact solar cell. The solar cell includes a porous insulating layer, a working electrode including a porous conducting metal layer formed on top of the porous insulating layer, and a light-absorbing layer containing an adsorbed dye arranged on top of the porous conducting metal layer to face the sun. The light-absorbing layer comprises $TiO_2$ metal oxide particles dyed by light-adsorbing dye molecules on the surface of the $TiO_2$ particles. The dye-sensitized solar cell further includes a counter electrode including a conducting layer disposed on an opposite side of the porous insulating layer. An electrolyte is filled between the working electrode and the counter electrode. An advantage of this solar cell is that it is easy and fast to manufacture, and accordingly it is cost-effective to produce. This document is silent about how the contacts should be arranged and how they can be produced.

WO2015/117795 discloses a dye-sensitized solar cell comprising a porous isolating substrate, a porous first conducting layer printed on one side of the porous isolating substrate and a porous second conducting layer printed on the other side of the porous isolating substrate. A light-absorbing layer comprising light-absorbing dye molecules is deposited on the first conducting layer. For example, the thickness of the first and second porous conductive layer is 20 µm, the thickness of the porous conductive powder layer is 16 µm, and the thickness of the light-absorbing layer is 60 µm. Each of the porous layers comprises a printed pattern including non-transparent and transparent portions arranged so that they form continuous transparent pathways through the solar cell. The solar cell comprises a first connection element electrically connected to the first conductive layer for connecting the first conductive layer to an external electric circuit, and a second connection element electrically connected to the second conductive layer for connecting the second conductive layer to the external electric circuit. For example, the connection elements are busbars. The connection elements may extend along the entire side of the layers. The non-transparent portions are in electric contact with the first connection element, and the non-transparent portions are in electric contact with the second connection element. The connection elements shown in the figures are disposed at a short side of the solar cell. A problem is that it is difficult to connect the connection elements to the first and second conducting layers, since the solar cell is very thin, and the first and second conducting layers are very thin, only approximately 20 µm.

US2013/0037089A1 discloses a dye-sensitized solar cell comprising a first conducting layer for extracting photo-generated electrons from a light-absorbing layer arranged at a top side of the solar cell unit and a second conducting layer arranged at a bottom side of the solar cell unit, a first conductor in electrical contact with the first conducting layer, a second conductor in electrical contact with the second conducting layer, and an encapsulation encapsulating the solar cell unit and comprising a bottom sheet covering the bottom side of the solar cell unit. The first conductor is arranged between the encapsulation and the solar cell unit at the top side of the solar cell unit, and the second conductor is arranged between the encapsulation and the solar cell unit at the bottom side of the solar cell unit.

SUMMARY

It is an aim of the present invention to at least partly overcome the above problems, and to provide an improved photovoltaic device for powering an external device.

This aim is achieved by a photovoltaic device as defined in claim 1.

The photovoltaic device comprises a solar cell unit including a working electrode comprising a porous light-absorbing layer arranged at a top side of the solar cell unit, a porous first conducting layer for extracting photo-generated electrons from the light-absorbing layer, wherein the light-absorbing layer is arranged on top of the first conducting layer, a porous substrate made of an insulating material, wherein the first conducting layer is formed on one side of the porous substrate, a counter electrode including a second conducting layer arranged at a bottom side of the solar cell unit, wherein the second conducting layer is formed on an opposite side of the porous substrate, and a conducting medium for transferring charges between the second conducting layer and the light-absorbing layer. The photovoltaic device further comprises at least one first conductor in electrical contact with the first conducting layer, at least one second conductor in electrical contact with the second conducting layer, and an encapsulation enclosing the solar cell unit, and comprising an at least partly transparent top sheet covering the top side of the solar cell unit and a bottom sheet covering the bottom side of the solar cell unit. The first and second conductors are arranged between the encapsulation and the solar cell unit at the bottom side of the solar cell unit. Further, the first conductor is electrically insulated from the second conducting layer, and a part of the porous substrate comprises conducting material disposed between the first conductor and the first conducting layer to provide electrical contact between the first conductor and the first conducting layer.

The second conductor is arranged between the second conducting layer and the bottom sheet of the encapsulation and the first conductor is arranged between the porous substrate and the bottom sheet of the encapsulation The first conductor works as a current collector and collects currents from the first conducting layer. The second conductor works as a current distributor and distributes currents to the second conducting layer.

To place the first conductors on the back surface is a much simpler process than placing them on the edges, as done in the prior art where the connections are disposed at a short side of the solar cell. As discussed in the background, the short side is very thin, and the precision required for placing the first conductors is extremely high and imposes very high accuracy of the producing machines.

By placing the first and second conductors between the encapsulation and solar cell unit, the encapsulation holds the first and second conductor in place and protects them.

With encapsulation is meant a cover sealingly enclosing the solar cell unit to prevent dust and damp from entering the solar cell unit and preventing liquid and air from the inside to leak out from the device.

The first conductor and the second conductor are disposed on the bottom side of the solar cell unit. Thus, there will then be no visible wiring on the upper side of the photovoltaic device. The first and second conductors can easily be hidden by disposing the photovoltaic device on a surface of an electronic device, such as a headset, a smart phone or a tablet, or on a cover of the electronic device. This means that the first conductor is not visible to a user when the photovoltaic device is placed on a surface of the electronic device. This makes it possible to integrate the photovoltaic device in the electronic device, or a cover of the electronic device, so that a user will not even notice it. Substantially a whole surface of the electronic device can be covered by the photovoltaic device. Thus, the whole surface of the electronic device or cover of the electronic device can be used to produce power without affecting the visible appearance of the electronic device.

The porous substrate comprises conducting material disposed between the first conductor and the first conducting layer. A part of the porous substrate disposed between the first conductor and the first conducting layer comprises conducting material to provide electrical contact between the first conductor and the first conducting layer. The conducting material forms conducting path between the first conductor and the first conducting layer. The remaining part of the porous substrate is electrically insulating and does not contain any conducting material to provide electrical insulation between the first and second conducting layers and avoid short circuit between the first and second conducting layers.

As previously discussed, the first conductor is in electrical contact with the first conducting layer and this may be done by arranging conducting material in the porous substrate at the location of the at least one first conductor. For example, a part of the porous substrate is provided with one or more holes filled with a conducting material. The conducting material is, for example, metal particles.

According to some aspects, an insulating gap is formed between the first conductor and the second conducting layer. The second conducting layer ends at a distance from the first conductor so that the insulating gap is formed between the first conductor and the second conducting layer. In other words, the second conducting layer does not cover the entire porous substrate and in the places where there is no second conducting layer on the porous substrate, there is arranged at least one first conductor with a distance between the second conducting layer and the first conductor. In other words, the at least one first conductor does not cover the entire porous substrate at the location where the second conducting layer does not cover the porous substrate.

According to some aspects, the first conductor is in mechanical contact with the part of the porous substrate comprising the conducting material. The first conductor abuts the porous substrate. The porous substrate has a bottom surface facing the first conductor, and the first conductor is in mechanical contact with the bottom surface of the porous substrate and in electrical contact with the conducting material in the porous substrate.

According to some aspects, the conducting material in the porous substrate is the same as in the first conducting layer. This facilitates manufacturing of the solar cell since the holes in the substrate can be filled at the same time as the first conducting layer is formed on the porous substrate.

According to some aspects, the conducting material in the porous substrate comprises titanium or an alloy thereof. It is advantageous to use titanium, for example if the conducting medium is an electrolyte, since titanium can resist corrosion caused by the electrolyte.

According to some aspects, the conducting material in the porous substrate comprises titanium or an alloy thereof, and the first conductor comprises titanium or an alloy thereof. This is advantageous when the first conductor is arranged in physical contact with the first conducting layer to provide a good electrical connection between the them.

According to some aspects, the second conducting layer has a bottom surface facing the bottom sheet, the second conductor is in mechanical and electrical contact with the bottom surface of the second conducting layer. The contacting surface between the second conductor and the bottom surface of the second conducting layer provides good electrical contact between them. The second conductor abuts the second conducting layer. According to some aspects, the encapsulation holds the second conductor in place.

According to some aspects, the first and second conducting layers comprise titanium or an alloy thereof. Although titanium has relatively low electrical conductivity for a metal, it is advantageous to use titanium in the first and second conducting layers since it is non-corrosive and can resist high temperatures in air, which is advantageous during manufacturing of the solar cell unit.

According to some aspects, the second conducting layer comprises titanium or an alloy thereof, and the second conductor comprises titanium or an alloy thereof. This is advantageous when the second conductor is arranged in physical contact with the second conducting layer to provide a good electrical connection between them. Due to the high temperatures during manufacturing of the solar cell unit there is a thin oxide layer on the titanium or titanium alloy of the conducting layers. It has been found that it is difficult to provide electrical contact between a conductor of a traditional conducting metal, such as copper or silver, and the first and second conducting layers due to the oxide layer on the titanium. Surprisingly, it has been discovered that a conductor comprising titanium provides good electrical connection between the conductor and the conducing layers of the solar cell unit despite the oxide layer on the titanium. Thus, it is advantageous to use titanium as conducting material, even though titanium has relatively low electrical conductivity.

According to some aspects, the first conductor comprises a conducting foil. According to some aspects, the second conductor comprises a conducting foil. Preferably, the foil is a metal foil. A foil can easily be cut in different shapes. The foil provides a wide contacting area and has a width which increases the throughput of electrons. This is advantageous when the first and second conductors are made of a material with relatively low electrical conductivity, such as titanium or an alloy thereof.

According to some aspects, the foil comprises titanium or an alloy thereof.

According to some aspects, the conducting foil has a width of at least 3 mm. This is advantageous when the conductor is made of a material with relatively low electrical conductivity, such as titan or an alloy thereof. The width is both for large contacting area, for increased flow of electrons and for easiness to handle. A thinner foil is harder to handle in the production process.

According to some aspects, the first and second conductors have a circular shape. This shape makes it easy to mount the conductors on the porous substrate and on the second conducting layer.

According to some aspects, the encapsulation comprises a plurality of penetrations in connection to the first and second conductors for connecting the photovoltaic device to the electronic device. In other words, there are penetrations in the encapsulation for accessing the power produced by the photovoltaic device. Some kind of wiring will be going through the penetrations. For example, the first and second conductors may extend out of the encapsulation through the penetrations to connect to wiring for powering the electronic device. Alternatively, wires from the outside of the encapsulation are going through the penetrations and electrically connect to the first and second conductors. The penetrations are tightly fit around the wiring passing through the encapsulation such that no gas or liquid can pass through penetrations. For example, the penetrations are openings in the encapsulation tightly fit around wiring passing through the encapsulation.

According to some aspects, the bottom sheet of the encapsulation comprises a plurality of penetrations arranged in connection to the first and second conductors to provide access to the power produced by the photovoltaic device, and the penetrations comprises penetration openings for receiving wires to electrically connect to the first and second conductors. This makes it easier to seal the penetrations.

According to some aspects, the first and second conductors are disposed within an area defined by the solar cell unit and said penetration openings are arranged below the first and second conductors to allow the wires to be attached to the first and second conductors. Thus, the first and second conductors do not protrude outside the solar cell unit. This makes it easier to seal the solar cell compared to if the conductors extend to the outside of the solar cell unit. The area defined by defined by the solar cell unit id defined by the edges of the solar cell unit.

According to some aspects, the first and second conductors have a circular shape, and the penetration openings are arranged below a central part of the first and second conductors.

According to some aspects, a part of the porous substrate disposed between the first conductor and the first conducting layer comprises holes filled with a conducting material, such as conducting particles.

According to some aspects, the conducting material comprises conducting particles accommodated in pores of the porous substrate so that they form a conducting path through the porous substrate between the first conductor and the first conducting layer. This can easily be achieved by infiltration of conducting particles in the part the porous substrate disposed between the first conductor and the first conducting layer. This is advantageous since it is easy to manufacture.

According to some aspects, the first conductor and second conductor comprise an elongated wire. At least one of the first and/or the second conductors is a wire. Alternatively, each of the first and second conductors is an elongated wire. A wire may be a cheap and durable option. Further, a wire can be made very thin and thus not disturb the appearance of the upper surface of the photovoltaic device if it is mounted on the upper side of the solar cell unit.

According to some aspects, the wire has an elongated kernel of a material with high electrical conductivity, for example silver, and the kernel has a cover of titanium or an alloy thereof. Such a wire will provide good electrical connection to conducting layers comprising titanium as well as have high electrical conductivity.

According to one aspect, the encapsulation is made of a transparent plastic. This feature contributes to provide a flexible, twistable, and impact resistant photovoltaic device.

BRIEF DESCRIPTION OF THE DRAWINGS

The invention will now be explained more closely by the description of different embodiments of the invention and with reference to the appended figures.

DETAILED DESCRIPTION

Figure 1:
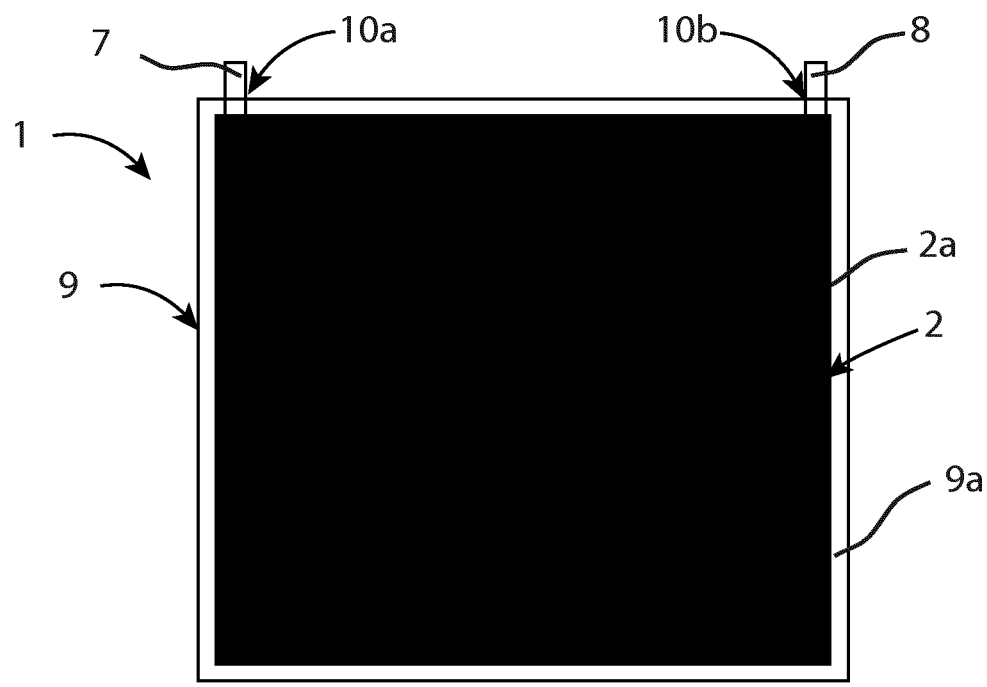
FIG. 1 shows an illustration from above of an example photovoltaic device with first and second conductors on a bottom side of the photovoltaic device.

Aspects of the present disclosure will be described more fully hereinafter with reference to the accompanying drawings. The photovoltaic device can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Unless otherwise defined, all terms used herein have the same meaning as commonly understood by one of ordinary skill in the art to which this disclosure belongs.

A photovoltaic device 1 suitable for powering an external device is provided.

FIG. 1 shows a view from above of a first example the photovoltaic device 1 with a solar cell unit 2 and a first conductor 7 and a second conductor 8. In FIG. 1, the first conductor 7 is arranged on the bottom side of the solar cell unit 2. The second conductor 8 is arranged on the bottom side of the solar cell unit 2.

Figure 2:
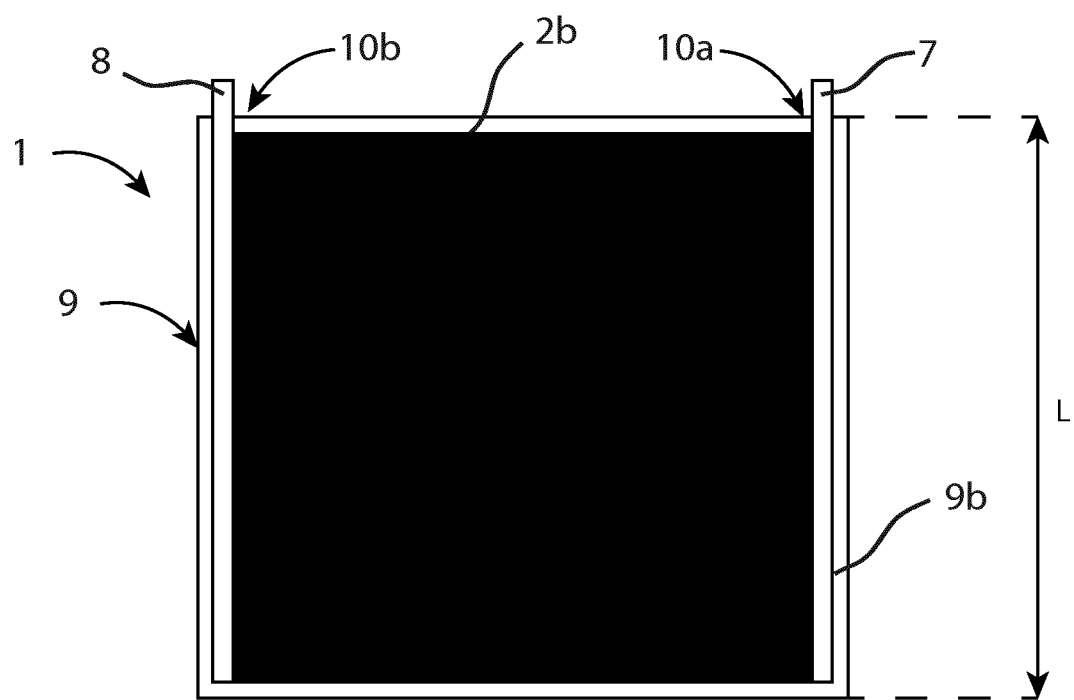
FIG. 2 shows the underside of the photovoltaic device shown in FIG. 1.

FIG. 2 shows the same photovoltaic devices 1as shown in FIG. 1 but from below. i.e. in FIG. 2 the bottom side 2*b* of the solar cell unit 2 is visible. In this view, the first conductor 7 and the second conductor 8 can be seen on the bottom side 2*b*.

It should be noted that in these figures, the first conductor and the second conductor are illustrated as having a length that goes all the way across the solar cell unit, but it is not necessarily so, as it is further explained below. Also, only one first conductor and one second conductor are illustrated but, as it is also explained below, there can be several.

Figure 3:
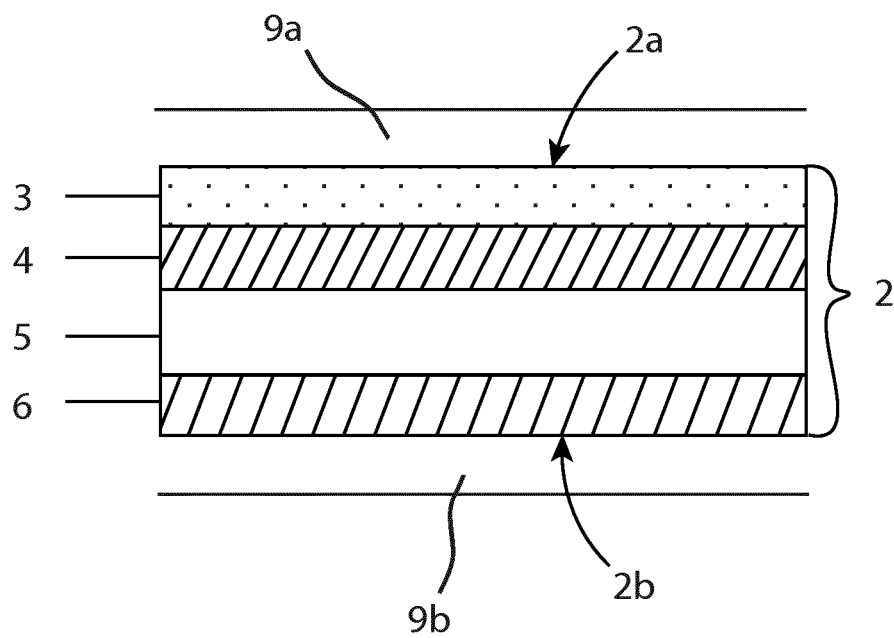
FIG. 3 shows an example of a cross-section of a solar cell unit in an encapsulation without first and second conductors.

The photovoltaic device comprises a solar cell unit 2. FIG. 3 shows a cross-section through an example of a solar cell unit 2 without any first and second conductors, to illustrate the layers of the solar cell unit 2. The solar cell unit 2 has a working electrode comprising a porous light-absorbing layer 3 arranged at a top side 2*a* of the solar cell unit 2. The solar cell unit 2 also includes a porous first conducting layer 4 for extracting photo-generated electrons from the light-absorbing layer 3, wherein the light-absorbing layer 3 is arranged on top of the first conducting layer 4, a porous substrate 5 made of an insulating material, wherein the first conducting layer 4 is formed on one side of the porous substrate 5. The solar cell unit 2 has a counter electrode including a second conducting layer 6 arranged at a bottom side 2*b* of the solar cell unit. The second conducting layer 6 is formed on an opposite side of the porous substrate 5. The second conducting layer 6 can be porous, but this is not necessary. In one aspect, the porous substrate is continuously extending through the entire solar cell unit. The solar cell unit 2 also includes a conducting medium for transferring charges between the second conducting layer 6 and the light-absorbing layer 3. 9*a* and 9*b* illustrate top sheet and bottom sheet of the encapsulation 9.

The first conducting layer 4 is in direct electrical contact with the light-absorbing layer 3. The porous substrate 5 provides electrical insulation between the first and second conducting layers 4, 6. In one aspect, porous substrate comprises a first portion including a network of conducting particles accommodated in the pores of the porous substrate, and a second portion without conducting particles. The first and second conducting layers 4, 6 are separated physically and electrically by the porous substrate 5. The porosity of the porous substrate 5 will enable the conducting medium to pass through the substrate. For example, the thickness of the porous substrate 5 is larger than 4 μm and less than 100 μm. The porosity of the first conducting layer 4 will enable the conducting medium to pass through the first conducting layer.

The porous light-absorbing layer 3 is, for example, a porous $TiO_2$ layer deposited onto the first conducting layer 4. The $TiO_2$ layer comprises $TiO_2$ particles dyed by adsorbing dye molecules on the surface of the $TiO_2$ particles. Alternatively, the porous light-absorbing layer 3 may comprise grains of a doped semiconducting material.

The top side 2*a* of the solar cell unit 2 should be facing the light to allow the light to hit the light-absorbing layer 3 of the working electrode. According to some aspects, the light-absorbing layer is a porous $TiO_2$ nanoparticle layer with adsorbed organic dye. Examples of organic dyes are: N719, N907, B11, C101. Other organic dyes can also be used. However, the light-absorbing layer 3 may also comprise grains of a doped semiconducting material, for example, Si, CdTe, CIGS, CIS, GaAs, or perovskite.

The conducting medium is, for example, a conventional electrolyte comprising iodide ($I^-$) and triiodide ($I_3^-$) ions or a similar electrolyte, or a Cu or Co complex based electrolyte. Solid state transition metal-based complexes or organic polymer hole conductors are known conducting mediums. According to some aspects, the conducting medium is PEDOT.

The photovoltaic device comprises at least one first conductor 7 in electrical contact with the first conducting layer 4, at least one second conductor 8 in electrical contact with the second conducting layer 6, and an encapsulation 9 enclosing the solar cell unit. The encapsulation 9 comprises an at least partly transparent top sheet 9*a* covering the top side of the solar cell unit and a bottom sheet 9*b* covering the bottom side of the solar cell unit. The photovoltaic device further comprises that the at least one first conductor 7 is arranged between the porous substrate 5 and the bottom sheet 9*b* at the bottom side 2*b* of the solar cell unit 2, the first conductor 7 is electrically insulated from the second conducting layer 6, and the first conductor 7 is in mechanical contact with an elongated part of the porous substrate 5, the at least one second conductor 8 is arranged between the encapsulation 9 and the solar cell unit 2 at the bottom side of the solar cell unit 2. The first conductor 7 is electrically connected to the first conducting layer 4, and the second conductor 8 is electrically connected to the second conducting layer 6.

Figure 4A:
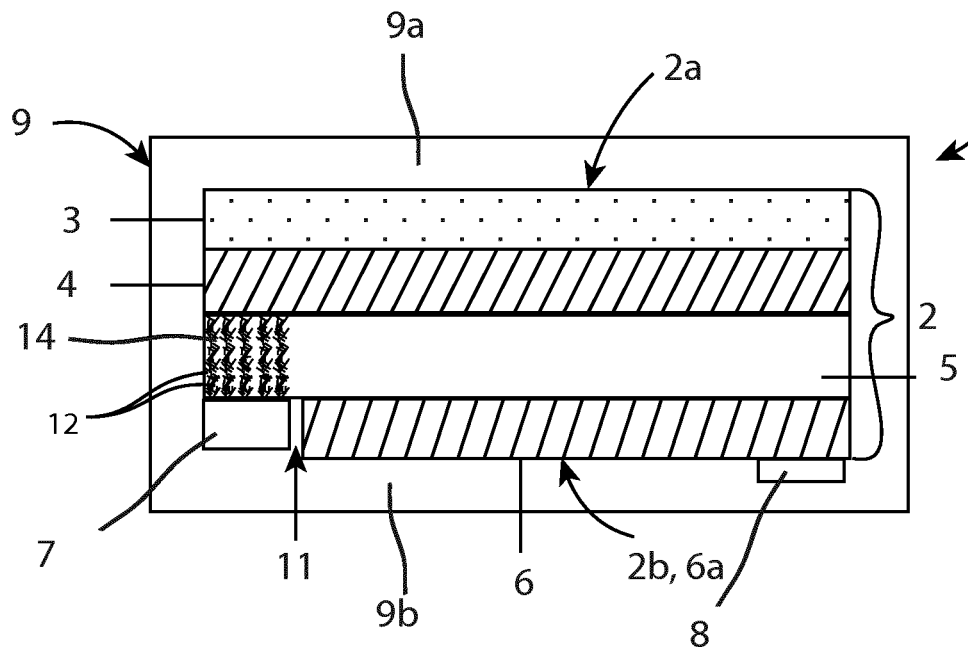
FIG. 4a shows one example of a cross-section of a photovoltaic device including a solar cell unit in an encapsulation and with first and second conductors on the bottom side of the solar cell unit.
Figure 4B:
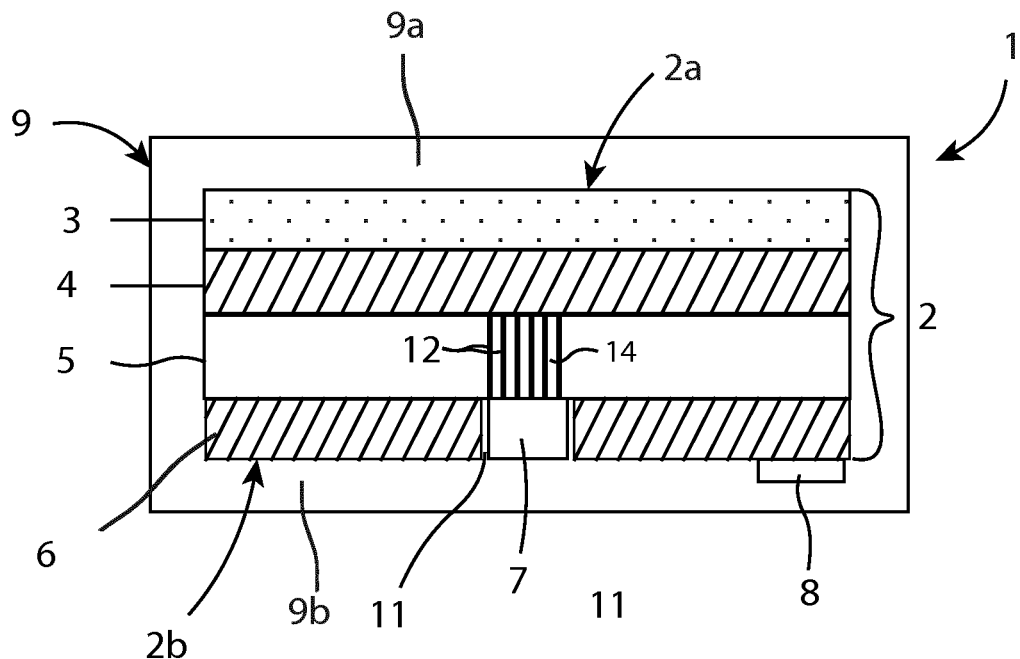
FIG. 4b shows another example of a cross-section of a photovoltaic device including a solar cell unit in an encapsulation and with first and second conductors on the bottom side of the solar cell unit.

A solar cell unit according to the above can be made big and cut in any shape. The first conductor is placed on the backside so that it is not visible from the front FIGS. 4*a* and 4*b* illustrate cross sections of examples of photovoltaic devices with a first conductor 7 on the bottom side 2*b*.

According to some aspects, at least the first conducting layer 4 and the porous substrate 5 are continuously extending through the entire solar cell unit 2. The light-absorbing layer 3 and the second conducting layer 6 extend continuously at least through a main part of the solar cell unit. In one example, as shown in FIGS. 4*a-b*, a minor part of the second conducting layer 6 can be removed so that the first conductor 7 can have electrical contact with the first conducting layer 4 from a bottom side 2*b* of the solar cell unit 2.

The solar cell unit 2 is, according to some aspects, filled with an electrolyte for transferring charges between the second conducting layer 6 and the light-absorbing layer 3. The electrolyte comprises ions, for example comprising iodide ($I^-$) and triiodide ($I_3^-$) ions or copper ions ($Cu^+$ and $Cu2+$). When the light-absorbing layer comprises $TiO_2$ particles, sunlight is harvested by the dye, producing photo-excited electrons that are injected into the conduction band of the $TiO_2$ particles and further collected by the first conducting layer 4. At the same time, ions in the electrolyte transport the electrons from the second conducting layer 6 to the light-absorbing layer 3. The first conductor 7 collects the electrons from the first conducting layer 4 and the second conductor 8 provides electrons to the second conducting layer 6 such that the solar cell unit can continuously produce power from the incoming photons. The electrolyte penetrates the pores of the light-absorbing layer 3, the first conducting layer 4, the porous substrate 5, for ions to be transferred between the second conducting layer 6 and the light-absorbing layer 3 and by that transfer electrons from the second conducting layer to the light-absorbing layer.

In an alternative embodiment, the photovoltaic device may comprise a light-absorbing layer including a doped semiconducting material, and the conducting medium is a solid hole/electron conductor, such as PEDOT:PSS, in physical contact with the doped semiconducting material as shown in WO2018021952. For example, the light-absorbing layer includes a plurality of grains of the doped semiconducting material, and the grains are partly covered with the conducting medium. The hole/electron conductor is electrically coupled to the second conducting layer 6 and electrically insulated from the first conducting layer 4.

The encapsulation 9 comprises a top sheet 9a covering a top side 2a of the solar cell unit 2, and a bottom sheet 9b covering a bottom side 2b of the solar cell unit 2. The encapsulation 9 encloses the solar cell unit 2 and, according to some aspects, the electrolyte, and acts as liquid barrier for the electrolyte and prevents the electrolyte from leaking from the photovoltaic device 1. The top sheet 9a is transparent, or at least the part covering the active area of the solar cell unit 2 is transparent so that incoming light can pass through to the light-absorbing layer 3. The top sheet 9a on the top side 2a of the solar cell unit 2 covers the light-absorbing layer 3 and allows light to pass through. The top and bottom sheets 9a-b are, for example, made of a polymer material. According to one aspect, the encapsulation is made of a transparent plastic. This feature contributes to provide a flexible, twistable, and impact resistant photovoltaic device. The top and bottom sheets 9a-b are sealed at the edges in order to protect the solar cell unit 2 against the surrounding atmosphere, and, according to some aspects, to prevent the evaporation or leakage of the electrolyte from the inside of the solar cell unit.

The counter electrode may comprise a catalytic layer. Alternatively, the second conducting layer 6 may comprise catalytic particles integrated in the second conducting layer.

For example, the first and second conducting layers 4, 6 are made of a material selected from a group consisting of titanium, titanium alloys, nickel alloys, graphite, and amorphous carbon, or mixtures thereof. Most preferably, the first and second conducting layers 4, 6 are made of titanium or a titanium alloy.

According to some aspects, the first and second conducting layers can be formed by a plurality of conducting particles bonded to each other. The conducting particles are suitably metal particles made of metal or metal alloy, for example, titanium or aluminium or an alloy thereof. The conductive particles of the first conducting layer 4 are in physical and electrical contact with each other, and the conductive particles of the second conducting layer 6 are in physical and electrical contact with each other.

The porous substrate is, according to some aspects, a sheet comprising woven microfibers. In another example, the porous substrate further comprises a layer of non-woven microfibers disposed on the woven microfibers. Suitably, the non-woven and woven microfibers of the porous substrate are made of glass fibres, which provides a robust and flexible substrate.

In one aspect, the first conducting layer is non-transparent and the upper surface of the solar cell unit 2 is homogeneously black, as shown in FIG. 1.

As is illustrated in FIGS. 1, 2, the encapsulation 9 comprises a plurality of penetrations 10a, 10b arranged in connection to the first conductor 7 and the second conductor 8 for connecting the photovoltaic device 1 to the external device and by that access the power produced by the photovoltaic device. For example, the penetrations are lead trough openings in the encapsulation. Some kind of wiring will be going through the openings. For example, the first and second conductors may extend out of the encapsulation through the penetrations to connect to wiring for powering the external device. Alternatively, wires from the outside of the encapsulation are going through the penetrations and are electrically connected to the first and second conductors. The penetrations are tightly fit around the wiring such that no gas or liquid can pass through them. In other words, the penetrations are sealingly closed around the wiring. The penetrations can be made by having the wires or conductors that should go through the holes in place when the encapsulation is arranged on the solar cell unit 2. The top sheet 9a and bottom sheet 9b are, for example, adhesive films that are put together over the solar cell unit 2. Alternatively, the top and bottom sheets are made of a flexible plastic material, and the edges of the top and bottom sheets are bonded to each other by melting the plastic material. If the wires/conductors are already in place between sheets before the bonding and protrude at the edges of the sheets, the penetrations 10a, 10b will be created during the bonding. Alternatively, the penetrations comprise through holes in the encapsulation made after encapsulation of the solar cell unit. The through holes are sealed after the wires/conductors have been arranged in the through holes. The locations of the penetrations will depend on the position of the first and second conductors.

The second conducting layer 6 has, according to some aspects, a bottom surface 6a facing the bottom sheet 9b, the at least one second conductor 8 is in mechanical and electrical contact with the bottom surface 6a. In this example, the contacting surface between the second conductor and the bottom surface is an elongated surface which provides good electrical contact between them and which is beneficial when returning electrodes to the solar cell unit 2 since electrons can be returned over a larger area. The length of the elongated part depends on the size of the solar cell unit and how many second conductors that are used. According to some aspects, the at least one second conductor 8 extends from side to side of the second conducting layer 6 along at least 50% of the length L of the solar cell unit, preferably along at least 70% of the length L, and most preferably along at least 90% of the length L. The efficiency of the solar cell unit is increased with good contact between the second conducting layer and the second conductor. Depending on the size of the solar cell unit, one or more second conductors may be used. For a larger solar cell unit, a longer second conductor 8 may be used. Several second conductors may also be used. The second conductor needs to provide enough electrons to the second conducting layer 6 so that the solar cell unit 1 is constantly refilled for producing more power.

The location of the second conducting layer 6 can be chosen depending on the size and the shape of the solar cell unit. According to some aspects, the second conductor 8 extends along an edge of the bottom side 2b of the solar cell unit 2. This may be beneficial if the solar cell unit is not irregular in shape. If the shape is irregular or the solar cell unit is large, the second conductor 8 may be placed across the surface of the bottom side 2b of the solar cell unit 2.

As for the second conductor, the length and location of the first conductor 7 can also be varied. According to some aspects, the at least one first conductor 7 extends from side to side of the solar cell unit along at least 50% of the length, preferably along at least 70% of the length, and most preferably along at least 90% of the length. The length also here, depends on the size and shape of the solar cell unit. A first conductor that covers more of the length gives, in general, a more efficient solar cell unit if it does not cover light-receiving surface but the length also depends on other factors, such as design and production technique.

The at least one first conductor 7 is arranged on the bottom side 2b of the solar cell unit 2, as shown in FIGS. 1, 2, 4a, and 4b. The at least one first conductor is arranged on the backside of the solar cell unit such that it is not at all visible from the top side, as shown in FIG. 1. Thus, according to some aspects, the at least one first conductor 7 is arranged between the porous substrate 5 and the bottom sheet 9b at the bottom side 2b of the solar cell unit 2, and the at least one first conductor 7 is electrically insulated from the second conducting layer 6, and wherein the at least one first conductor 7 is in mechanical contact with an elongated part of the porous substrate 5. The at least one first conductor is electrically insulated from the second conducting layer so as to not short circuit the solar cell unit. The first conductor 7 can be arranged in electrical contact with the first conducting layer 4 in different ways. For example, a part of the porous substrate 5 disposed between the first conductor 7 and the first conducting layer 4 comprises a conducting material 12. The conducting material is, for example, a metal.

FIG. 4a shows one example of how to arrange the first conductor 7 in electrical contact with the first conducting layer 4. A part 14 of the porous substrate 5 comprises conducting material 12. The part 14 is disposed between the first conductor 7 and the first conducting layer 4 to provide electrical contact between the first conductor and the first conducting layer. The remaining part of the porous substrate 5 is electrically insulating and does not contain any conducting material to provide electrical insulation between the first and second conducting layers and thus avoid short circuit between the first and second conducting layers.

In this example, the conducting material 12 comprises conducting particles accommodated in pores of the porous substrate and forming conducting paths through the porous substrate and between the first conductor 7 and the first conducting layer 4. This can be achieved by infiltrating the porous substrate with conducting particles between the first conductor and the first conducting layer. The size of the conducting particles is smaller than the size of the pores of the porous substrate so that the conducting particles can be accommodated in the pores of the porous substrate. The conducting particles then form a conducting network through the insulating material of the porous substrate. The conducting network is in electrical contact with the at least one first conductor 7 and the first conducting layer 4.

FIG. 4b shows another example of how to arrange the first conductor 7 in electrical contact with the first conducting layer 4. In this example, a part 14 of the porous substrate 5 disposed between the first conductor 7 and the first conducting layer 4 comprises one or more through holes filled with a conducting material, for example, conducting particles. The holes in the substrate can, for example, be achieved by a laser or a needle. The holes can be made before applying the first conducting layer on the substrate. The holes are then filled with conducting material when the first conducting layer is applied on the substrate. In this case, the conducting material 12 is the same conducting material as is used in the first conducting layer. According to some aspects, the second conducting layer 6 ends at a distance from the first conductor 7 so that an insulating gap 11 is formed between the first conductor 7 and the second conducting layer 6 to prevent short circuit between the first and second conducting layers.

According to some aspects, the conducting material 12 is the same material as is used in the second conducting layer 6. According to some aspects, the conducting material 12 is the same material as is used in the first conducting layer 4. The conducting material 12 can be made of metal, metal alloy, or other conducting materials, for example, titanium, titanium alloys, nickel, nickel alloys, carbon-based materials, conducting oxides, conducting nitrides, conducting carbides, conducting silicides, or mixtures thereof. For example, the conducting particles are made from a material selected from a group consisting of titanium, titanium alloys, nickel, nickel alloys, carbon-based materials such as graphene or graphite or carbon black or carbon nanotubes, conducting oxides, conducting nitrides, conducting carbides, conducting silicides or mixtures thereof.

When the at least one first conductor 7 is arranged on the bottom side 2b, the at least one first conductor 7 is electrically insulated from the second conducting layer 6. According to some aspects, an insulating gap 11 is formed between the first conductor 7 and the second conducting layer 6, as shown in FIGS. 4a and 4b. In other words, the second conducting layer 6 does not cover the entire porous substrate, and in the places where there is no second conducting layer 6 on the porous substrate 5, at least one first conductor 7 is arranged with a distance between the second conducting layer 6 and the first conductor 7. In other words, the at least one first conductor 7 does not cover the entire porous substrate 5 at the location where the second conducting layer 6 does not cover the porous substrate. The insulating gap 11 may be filled with an insulating material to increase the insulating properties of the insulating gap.

Figure 5:
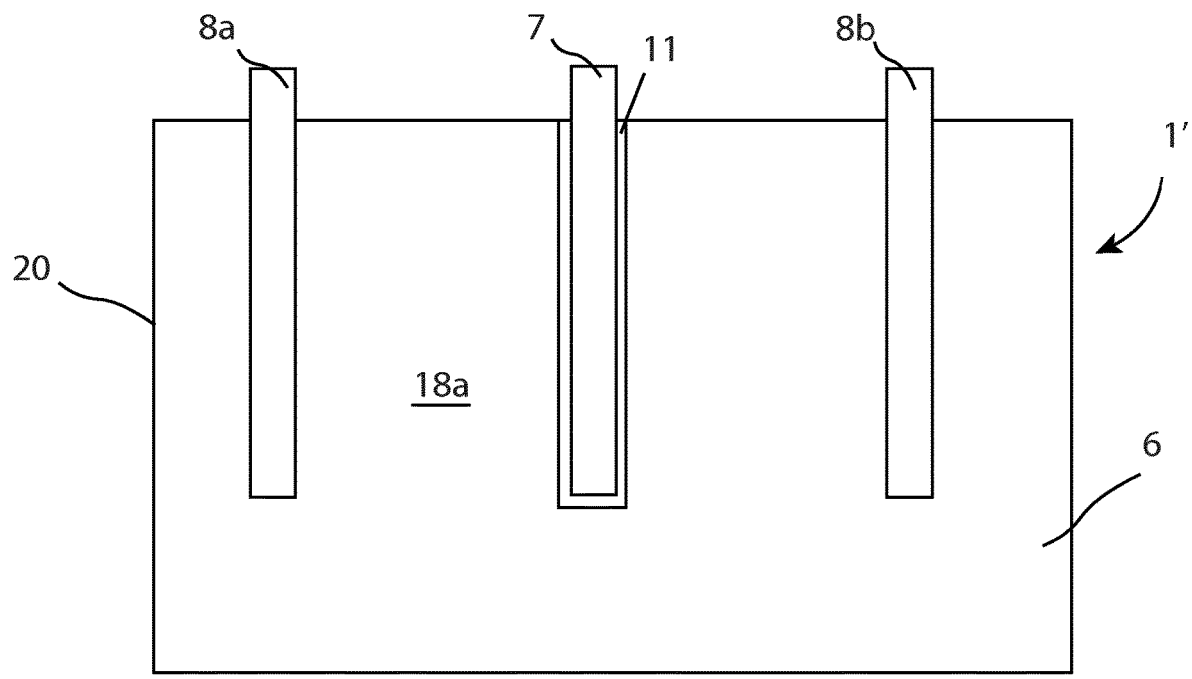
FIG. 5 shows another example of a photovoltaic device seen in a view from below.
Figure 6:
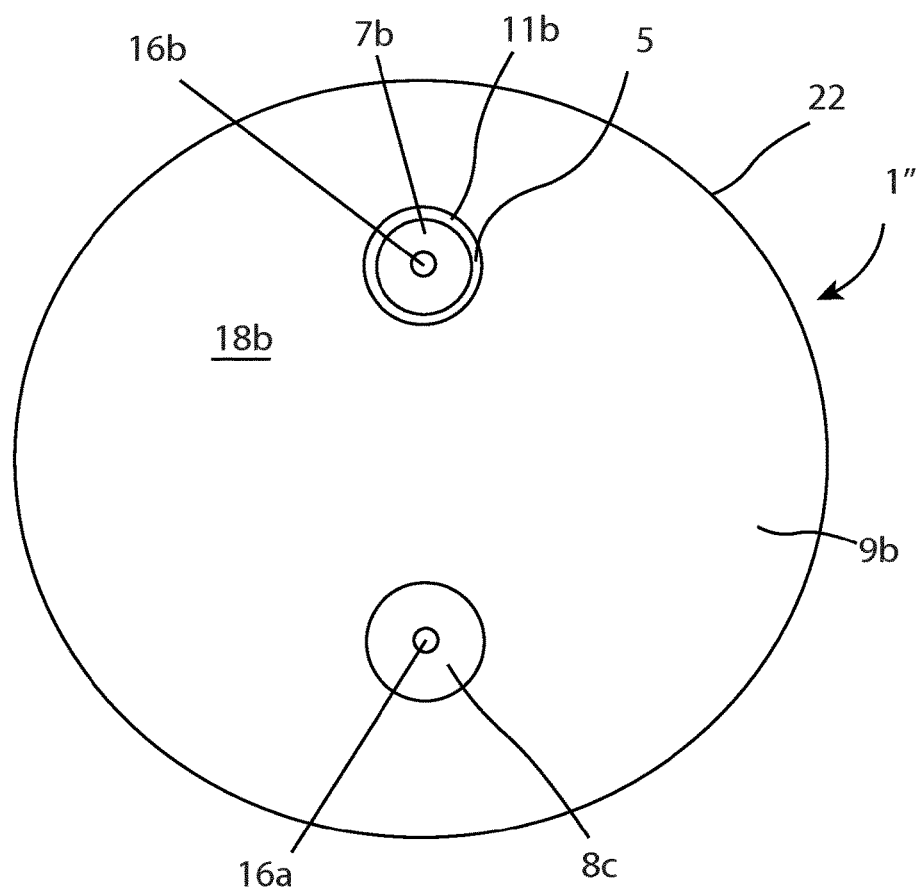
FIG. 6 shows yet another example of a photovoltaic device seen in a view from below.

The first conductor can be arranged along an edge of the porous substrate, as shown in FIG. 4a, or on the surface of the porous substrate at any position, for example, as shown in FIG. 4b and FIGS. 5 and 6.

The shape of the first and second conductors may vary. For example, the shape can be rectangular or circular.

According to some aspects, the first and second conducting layers 4, 6 comprise titanium or an alloy thereof. Although titanium has relatively low electrical conductivity for a metal, it is advantageous to use titanium in the first and second conducting layers since it is non-corrosive and can resist high temperatures in air, which is advantageous during manufacturing of the solar cell unit. According to an aspect, the second conductor 8 is made of titanium or an alloy thereof. According to another aspect, the first conductor 7 is made of titanium or an alloy thereof. This is advantageous when the first and second conductors are arranged in physical contact with the first and second conducting layers to provide a good electrical connection between the conductors and the conducing layers. Due to the high temperatures during manufacturing of the solar cell unit there is a thin oxide layer on the titanium or titanium alloy of the second conducting layer. It has been found that it is difficult to provide electrical contact between a conductor of a traditional conducting metal, such as copper or silver, and the first and second conducting layers due to the oxide layer on the titanium. Surprisingly, it has been discovered that a conductor comprising titanium provides good electrical connection with the conducing layers of the solar cell unit despite the oxide layer on the titanium. Thus, it is advantageous to use titanium as conducting material in the first and second conductor, even though titanium has relatively low electrical conductivity.

According to some aspects, the second conductor 8 comprises a conducting foil. According to some aspects, the first conductor 7 comprises an conducting foil. The foil provides a wide contacting area, which is advantageous when the conductor is made of a material with relatively low electrical conductivity, such as titan or an alloy thereof. According to some aspects, the conducting foil has a width of at least 3 mm. This is advantageous when the conductor is made of a material with relatively low electrical conductivity, such as titan or an alloy thereof. The width is both for large contacting area, for increased flow of electrons and for easiness to handle. A thinner foil is harder to handle in the production process. One option for the foil is using a wire. In one aspect, the first and second conductors 7, 8 comprises titanium or an alloy thereof. Alternatively, the first and second conductors 7, 8 may comprise nickel or chromium or alloys thereof.

Alternatively, the first conductor 7 and second conductor 8 comprise an elongated wire. The wire may be a cheap and durable option. The wire is thinner than a foil and can be used on the front side of the solar cell unit, without disturbing the appearance of the photovoltaic device. According to one aspect, the wire has an elongated kernel of a material with high electrical conductivity, for example, of metal, such as silver, and the kernel has a cover of titanium or an alloy thereof. Such a wire will provide good electrical connection to conducting layers comprising titanium as well as high electrical conductivity.

FIG. 5 shows another example of a photovoltaic device 1' seen in a view from below. The photovoltaic device 1' comprises a first conductor 7 partly surrounded by an insulating gap 11. The second conducting layer 6 ends at a distance from the first conductor 7 so that the insulating gap 11 is formed between the first conductor 7 and the second conducting layer 6. The first conductor 7 is attached to a surface of the porous substrate, in the same way as shown in FIGS. 4*a-b*. In this example, the first conductor 7 is elongated and protrudes outside an area 18*a* defined by the solar cell unit, i.e. outside the edges 20 of the solar cell unit. In this example, the solar cell is rectangular and accordingly the area 18*a* defined by the solar cell is rectangular. In this example, the photovoltaic device 1' comprises two second conductors 8*a-b* attached to a bottom surface of the second conducting layer 6. The two second conductors 8*a-b* are elongated and protrudes outside the area defined by the solar cell unit. The number of first and second conductors may vary.

FIG. 6 shows yet another example of a photovoltaic device 1" seen in a view from below. The photovoltaic device 1' comprises a first conductor 7*b* surrounded by an insulating gap 11*b*. The first conductor 7*b* is attached to a surface of the porous substrate 5, in the same way as shown in FIGS. 4*a-b*. In this example, the first conductor 7*b* has a circular shape and the insulating gap 11*b* is annular. In this example, the first conductor 7*b* is disposed at a distance from the edge 22 of the solar cell unit. Accordingly, the first conductor 7*b* is disposed within an area 18*b* defined by the solar cell unit. In this example, the solar cell unit is circular, and accordingly the area defined by the solar cell unit is circular. The photovoltaic device 1' comprises a second conductor 8*c* attached to a bottom surface of the second conducting layer. In this example, the second conductor 8*c* has a circular shape. In this example, the second conductor 8*c* is disposed at a distance from the edge 22 of the solar cell unit. Accordingly, the first and the second conductors 7*b*, 8*c* are disposed within an area 18*b* defined by the solar cell unit. Thus, the first and second conductors 7*b*, 8*c* do not extend outside of the solar cell unit.

The second conducting layer 6 is covered by the bottom sheet 9*b* of the encapsulation 9. The bottom sheet 9*b* comprises two penetration openings (16*a-b*) for receiving wires to electrically connect to the first and second conductors. The penetration openings 16*a-b* are arranged below the first and second conductors 7*b*, 8*c*. The term below relates to a solar cell unit in use with the upper side facing the sun, for example, as shown in FIG. 4*b*. In this example, the penetration openings 16*a-b* are arranged below a central part of the first and second conductors 7*b*, 8*c*. The central part comprises centrum of the circular conductor. Due to the fact that the first and the second conductors 7*b*, 8*c* are disposed within the area 18*b* defined by the solar cell unit, sealing of the penetration openings is facilitated. It is more difficult to seal the penetrations if the conductors extend outside the area of the solar cell unit, as shown in FIGS. 1, 2 and 5.

The solar cell unit 2 can be produced in any size or shape. The limit for the size mainly comes from easiness to handle the solar cell unit. Since the first conductors can be arranged such that there are no visible first conductors extending across the top surface of the solar cell unit, the surface of the top side of the solar cell unit becomes visually homogenous. There are no visible first conductors across the top surface of the solar cell when the first conductor is arranged at the bottom side of the solar cell unit. This means that the appearance of the upper side of the device is uniform, and not interrupted by any first conductors or has any changes in color. This makes it possible to integrate the photovoltaic device in electronic devices without impairing the visible appearance of the electronic device. A user may even not notice the photovoltaic device.

With active area it is meant the area of the solar cell unit, which contributes to produce power when it is exposed to light. The size of the solar cell, i.e. the length and width of the solar cell unit may vary depending on which external device it is adapted to power. Accordingly, the active area of the solar cell unit may vary depending on the need of power. For example, the size of the solar cell unit may vary between 1×1 cm with an active area of 1 cm$^2$ and 1×1 m with an active area of 1 m$^2$.

There are several possible variations to the solar cell unit 2 and in how to produce it. In addition to the details disclosed here, published patent application WO2013149787 (A1) and WO2014184379 (A1) and as well as unpublished EP application EP17209762.8 describe how to produce the solar cell unit 2. Accordingly, the three documents are herein disclosed by reference.

The photovoltaic device 1 of the present disclosure thus has a solar cell unit provided according to a method disclosed in any of the above referenced documents.

The method comprises providing a solar cell unit 2 including a working electrode comprising a porous light-absorbing layer 3 arranged at a top side 2a of the solar cell unit, a porous first conducting layer 4 for extracting photo-generated electrons from the light-absorbing layer 3, wherein the light-absorbing layer 3 is arranged on top of the first conducting layer 4, a porous substrate 5 made of an insulating material, wherein the first conducting layer 4 is formed on one side of the porous substrate 5, a counter electrode including a second conducting layer 6 arranged at a bottom side of the solar cell unit, wherein the second conducting layer 6 is formed on an opposite side of the porous substrate 5, and a conducting medium for transferring charges between the second conducting layer 6 and the light-absorbing layer 3. Hence, these steps, and variations thereof, are discussed in the above referenced documents.

The method further comprises attaching at least one first conductor 7 to a bottom sheet 9b, attaching at least one second conductor 8 to the bottom sheet 9b and arranging the top sheet 9a to cover the top side of the solar cell unit 2 and the bottom sheet 9b to cover the bottom side of the solar cell unit such that the top sheet 9a and the bottom sheet 9b form an encapsulation 9 enclosing the solar cell unit 2. The at least one first conductor 7 is attached to the bottom sheet 9b such that it is in electrical contact with the first conducting layer 4 when the encapsulation 9 is formed and wherein the at least one second conductor 8 is attached to the bottom sheet 9b such that it is in electrical contact with the second conducting layer 6 when the encapsulation 9 is formed. Thus, the photovoltaic device described above is produced. The method provides a way to produce the device where there is no need for any adhesive material between the first conductors and the conducting layers. It is also easy to handle the thin first conductors when they are attached to the encapsulation sheets 9a and 9b. In other words, when producing the photovoltaic device, the solar cell unit is provided and when the first conductor and second conductor are to be arranged on the solar cell unit, they are first put on the corresponding location on the bottom sheet 9b such that when the top sheet 9a and the bottom sheet 9b are arranged on the solar cell unit, the first conductor and the second conductor are collocated to their positions on the solar cell unit.

The present invention is not limited to the embodiments disclosed but may be varied and modified within the scope of the following claims. For example, the photovoltaic device may comprise more than one second conductor arranged between the encapsulation and the solar cell unit. The photovoltaic device may also comprise more than one first conductor arranged between the encapsulation and the solar cell unit. The number of penetrations can vary. There is at least one penetration for each of the first and second conductor. However, it is also possible to have a plurality of penetrations for each of the first and second conductors.

The invention claimed is:

1. A photovoltaic device comprising:
 a solar cell unit comprising stacked layers, including:
  a working electrode layer comprising a porous light-absorbing layer arranged at a top side of the solar cell unit,
  a first conducting layer for extracting photo-generated electrons from the light-absorbing layer, wherein the light-absorbing layer is arranged on top of the first conducting layer,
  a porous substrate layer made of an insulating material, wherein the first conducting layer is formed on a top side of the porous substrate layer,
  a counter electrode layer including a second conducting layer arranged at a bottom side of the solar cell unit that is parallel to the top side of the solar cell unit, wherein the second conducting layer is formed on a bottom side of the porous substrate layer and each of the light-absorbing layer, the first conducting layer, the porous substrate layer, and second conducting layer are parallel to the top and bottom sides of the solar cell unit so that the second conducting layer is spaced apart from the first conducting layer in a direction extending normal from the top side of the solar cell unit to the bottom side of the solar cell unit with the porous substrate layer between the first and second conducting layers, and wherein the solar cell unit further comprises a conducting medium for transferring charges between the second conducting layer and the light-absorbing layer, wherein the porosity of the porous substrate layer enables the conducting medium to pass through the porous substrate layer,
 a first conductor below the porous substrate layer and the first conducting layer in the direction extending normal from the top side of the solar cell unit to the bottom side of the solar cell unit, and the first conductor is in electrical contact with the first conducting layer,
 a second conductor below the counter electrode layer in the direction extending normal from the top side of the solar cell unit to the bottom side of the solar cell unit, and the second conductor in electrical contact with the second conducting layer, and
 an encapsulation encapsulating the solar cell unit and comprising an at least partly transparent top sheet covering the top side of the solar cell unit and a bottom sheet covering the bottom side of the solar cell unit, wherein the second conductor is arranged between the second conducting layer and the bottom sheet of the encapsulation at the bottom side of the solar cell unit, and the first conductor is arranged between the porous substrate layer and the bottom sheet at the bottom side of the solar cell unit,
 wherein the first conductor is electrically insulated from the second conducting layer, and
 wherein a part of the porous substrate layer comprises conducting material disposed between the first conductor and the first conducting layer to provide electrical contact between the first conductor and the first conducting layer, wherein the conducting material is separate from the conducting medium and comprises conducting particles accommodated in pores of said part of the porous substrate layer, wherein the conducting particles form a conducting path through the porous substrate layer between the first conductor and the first conducting layer.

2. The photovoltaic device according to claim 1, wherein an insulating gap is formed between the first conductor and the second conducting layer.

3. The photovoltaic device according to claim 1, wherein the first conductor is in mechanical contact with said part of the porous substrate layer and in electrical contact with the conducting material in the porous substrate layer.

4. The photovoltaic device according to claim 1, wherein the second conducting layer has a bottom surface facing the bottom sheet, the second conductor is in mechanical and electrical contact with the bottom surface.

5. The photovoltaic device according to claim 1, wherein the second conducting layer comprises titanium or an alloy thereof, and the second conductor comprises titanium or an alloy thereof.

6. The photovoltaic device according to claim 1, wherein the conducting material of the porous substrate layer comprises titanium or an alloy thereof, and the first conductor comprises titanium or an alloy thereof.

7. The photovoltaic device according to claim 1, wherein the first and second conductors comprises a conducting foil.

8. The photovoltaic device according to claim 1, wherein the bottom sheet of the encapsulation comprises a plurality of penetration openings for receiving wires to electrically connect to the first and second conductors, and the penetration openings are arranged in connection to the first and second conductors.

9. The photovoltaic device according to claim 8, wherein the first and second conductors are disposed within an area defined by the solar cell unit and said penetration openings are arranged below the first and second conductors.

10. The photovoltaic device according to claim 1, wherein the first and second conductors have a circular shape.

11. The photovoltaic device according to claim 8, wherein said penetration openings are arranged below a central part of the first and second conductors.

12. The photovoltaic device according to claim 1, wherein the first conductor is laterally adjacent the counter electrode layer and overlaps with the counter electrode layer in the direction extending normal from the top side of the solar cell unit to the bottom side of the solar cell unit.

13. The photovoltaic device according to claim 2, wherein the first conductor is at least partly surrounded by the insulating gap formed between the first conductor and the second conducting layer.

14. The photovoltaic device according to claim 1, wherein a remaining part of the porous substrate layer is substantially free of any conducting material and is electrically insulating.

15. A photovoltaic device comprising:
a solar cell unit comprising stacked layers, including:
a working electrode layer comprising a porous light-absorbing layer arranged at a top side of the solar cell unit,
a porous first conducting layer for extracting photo-generated electrons from the light-absorbing layer, wherein the light-absorbing layer is arranged on top of the first conducting layer,
a porous substrate layer made of an insulating material, wherein the first conducting layer is formed on a top side of the porous substrate layer,
a counter electrode layer including a second conducting layer arranged at a bottom side of the solar cell unit that is parallel to the top side of the solar cell unit, wherein the second conducting layer is formed on a bottom side of the porous substrate layer and each of the light-absorbing layer, the first conducting layer, the porous substrate layer, and second conducting layer are parallel to the top and bottom sides of the solar cell unit so that the second conducting layer is spaced apart from the first conducting layer in a direction extending normal from the top side of the solar cell unit to the bottom side of the solar cell unit with the porous substrate layer between the first and second conducting layers, and wherein the solar cell unit further comprises a conducting medium for transferring charges between the second conducting layer and the light-absorbing layer, wherein the porosity of the porous substrate layer enables the conducting medium to pass through the porous substrate layer,
a first conductor below the porous substrate layer and the first conducting layer in the direction extending normal from the top side of the solar cell unit to the bottom side of the solar cell unit, and the first conductor is in electrical contact with the first conducting layer,
a second conductor below the counter electrode layer in the direction extending normal from the top side of the solar cell unit to the bottom side of the solar cell unit, and the second conductor in electrical contact with the second conducting layer, and
an encapsulation encapsulating the solar cell unit and comprising an at least partly transparent top sheet covering the top side of the solar cell unit and a bottom sheet covering the bottom side of the solar cell unit, wherein the second conductor is arranged between the second conducting layer and the bottom sheet of the encapsulation at the bottom side of the solar cell unit, and the first conductor is arranged between the porous substrate layer and the bottom sheet at the bottom side of the solar cell unit,
wherein the first conductor is electrically insulated from the second conducting layer, the first conductor at least partly surrounded by an insulating gap that is formed between the first conductor and the second conducting layer, the insulating gap filled with an insulating material, and
wherein the porous substrate layer comprises a first portion and a second portion, the first portion of the porous substrate layer includes conducting material disposed between the first conductor and the first conducting layer to provide electrical contact between the first conductor and the first conducting layer, and the second portion of the porous substrate layer is substantially free of any conducting material and is electrically insulating, wherein the conducting material is separate from the conducting medium.

16. The photovoltaic device according to claim 15, wherein the first conductor is in mechanical contact with the first portion of the porous substrate layer and in electrical contact with the conducting material in the porous substrate layer.

17. The photovoltaic device according to claim 15, wherein at least a portion of the first conductor is completely surrounded by the insulating gap that is formed between the first conductor and the second conducting layer.

18. The photovoltaic device according to claim 15, wherein the conducting material comprises conducting particles accommodated in pores of the first portion of the porous substrate layer such that the conducting particles form a conducting network through the insulating material of the porous substrate layer between the first conductor and the first conducting layer.

19. The photovoltaic device according to claim 15, wherein the first conductor is laterally adjacent the counter electrode layer and overlaps with the counter electrode layer in the direction extending normal from the top side of the solar cell unit to the bottom side of the solar cell unit.

20. A photovoltaic device comprising:
a solar cell unit comprising stacked layers, including:
a working electrode layer comprising a porous light-absorbing layer arranged at a top side of the solar cell unit,
a porous first conducting layer for extracting photo-generated electrons from the light-absorbing layer, wherein the light-absorbing layer is arranged on top of the first conducting layer,
a porous substrate layer made of an insulating material, wherein the first conducting layer is formed on a top side of the porous substrate layer, a counter electrode layer including a second conducting layer arranged at a bottom side of the solar cell unit that is parallel to the top side of the solar cell unit, wherein the second conducting layer is formed on a bottom side of the porous substrate layer and each of the light-absorbing layer, the first conducting layer, the porous substrate layer, and second conducting layer are parallel to the top and bottom sides of the solar cell unit so that the second conducting layer is spaced apart from the first conducting layer in a direction extending normal from the top side of the solar cell unit to the bottom side of the solar cell unit with the porous substrate layer between the first and second conducting layers, and wherein the solar cell unit further comprises a conducting medium for transferring charges between the second conducting layer and the light-absorbing layer, a first conductor below the porous substrate layer and the first conducting layer in the direction extending normal from the top side of the solar cell unit to the bottom side of the solar cell unit, and the first conductor is in electrical contact with the first conducting layer, a second conductor below the counter electrode layer in the direction extending normal from the top side of the solar cell unit to the bottom side of the solar cell unit, and the second conductor in electrical contact with the second conducting layer, and an encapsulation encapsulating the solar cell unit and comprising an at least partly transparent top sheet covering the top side of the solar cell unit and a bottom sheet covering the bottom side of the solar cell unit, wherein the second conductor is arranged between the second conducting layer and the bottom sheet of the encapsulation at the bottom side of the solar cell unit, and the first conductor is arranged between the porous substrate layer and the bottom sheet at the bottom side of the solar cell unit, wherein the first conductor is electrically insulated from the second conducting layer, wherein a part of the porous substrate layer comprises conducting material disposed between the first conductor and the first conducting layer to provide electrical contact between the first conductor and the first conducting layer, the conducting material is separate from the conducting medium, and wherein the first conductor directly contacts a surface of the porous substrate layer with the first conductor in mechanical contact with said part of the porous substrate layer and in electrical contact with the conducting material in the porous substrate layer.

* * * * *